(12) United States Patent
Harris et al.

(10) Patent No.: US 6,659,779 B1
(45) Date of Patent: Dec. 9, 2003

(54) ELECTRONIC ASSEMBLY HAVING A REMOVABLE POWER SUPPLY

(75) Inventors: Shaun L. Harris, McKinney, TX (US); Eric C. Peterson, McKinney, TX (US); David Fisk, Carrollton, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/237,317

(22) Filed: Sep. 9, 2002

(51) Int. Cl.[7] .................................................. H05K 1/00
(52) U.S. Cl. ......................... 439/67; 361/784; 361/789
(58) Field of Search ................... 439/67, 77; 174/254; 361/784, 789

(56) References Cited

U.S. PATENT DOCUMENTS

| | | | |
|---|---|---|---|
| 5,161,986 A | | 11/1992 | Gulbranson et al. |
| 5,198,965 A | * | 3/1993 | Curtis et al. ................. 361/717 |
| 5,650,910 A | * | 7/1997 | Winick et al. ............... 361/683 |
| 5,936,850 A | * | 8/1999 | Takahashi et al. ........... 361/784 |
| 5,980,267 A | | 11/1999 | Ayers et al. |

* cited by examiner

Primary Examiner—Hung V. Ngo

(57) ABSTRACT

An electronic device comprises a first chassis, a second chassis, and at least one flexible circuit extending therebetween. The first chassis is oriented along a first axis and comprises at least one first microprocessor. The second chassis is oriented along a second axis and comprises at least one power generating component. The flexible circuit comprises a first end and a second end, wherein the first end is connectable to the first chassis and the second end is connectable to the second chassis. The first chassis is movable relative to the second chassis between a position wherein the first axis is substantially perpendicular to the second axis and a position wherein the first axis is substantially parallel to the second axis.

31 Claims, 10 Drawing Sheets

ELECTRONIC ASSEMBLY HAVING A REMOVABLE POWER SUPPLY

BACKGROUND

The delivery of direct current (DC) power free of transients or other fluctuations is crucial for the operation of many high performance electronic devices. Many of these electronic devices operate at very high frequencies and are adversely affected by transients or other fluctuations in their power supplies. Even small transients or fluctuations will adversely affect many electronic devices. For example, a slight voltage transient in a power supply of a high speed processor may cause data errors, such as a low voltage signal being registered or otherwise interpreted by the processor as a high voltage signal.

Power supplies are typically located on circuit boards that are separate from other components, such as processors, of the electronic devices. This separation provides for simplification of manufacturing in addition to isolating the power supplies from the other components of the electronic devices. The power supplies and other components are able to be manufactured at different locations and connected together at a later time during final assembly. Likewise, either the power supplies or the other components may be repaired or retrofit without the need to repair or retrofit the other. In addition, the separation provides isolation between the power supplies and the other components and reduces the probability that a transient generated in the power supply will be able to affect the operation of the electronic devices.

The isolation, however, creates problems in delivering DC power that is free of transients and other fluctuations to the components of the electronic devices. For example, the conductors that are used to transfer power from the power supplies to the electronic device inherently have inductance and resistance. The inductance increases the probability that a transient will occur on the power supply line, which will adversely affect the performance of the electronic device. The resistance reduces the power that is supplied to the components of the electronic device and increases the heat generated by the electronic device.

In many applications, a cable is connected between the power supply and the electronic device. The flexibility of a cable typically enables the power supply and the electronic device to be connected and disconnected with relative ease. Cables, however, typically have a higher impedance, which in turn makes them more likely to generate transients and voltage fluctuations. Therefore, cables present problems when used in many high speed applications.

SUMMARY

An electronic device comprising a first chassis, a second chassis, and at least one flexible circuit extending therebetween is disclosed. In one non-limiting embodiment, the first chassis is oriented along a first axis and comprises at least one first microprocessor. The second chassis is oriented along a second axis and comprises at least one power generating component connectable thereto. The flexible circuit extends between the first chassis and the second chassis. The flexible circuit comprises a first end and a second end, wherein the first end is connectable to the first chassis and the second end is connectable to the second chassis. The first chassis is movable relative to the second chassis between a position wherein the first axis is substantially perpendicular to the second axis and a position wherein the first axis is substantially parallel to the second axis.

DESCRIPTION

Figure 1:
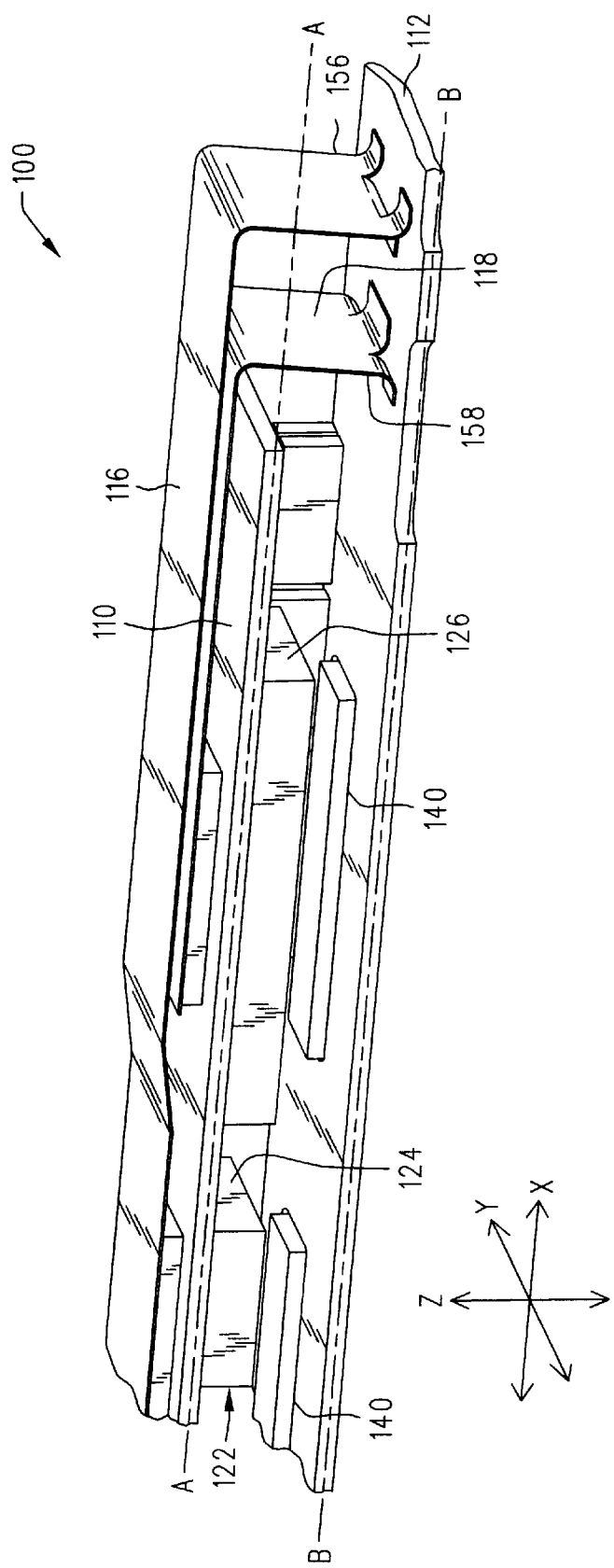
FIG. 1 is a top perspective view of an electronic device having a power board connectable to a processor board according to an embodiment of the present invention.

A non-limiting embodiment of an electronic device 100 is shown in FIG. 1. The electronic device 100 may have a first chassis 110, sometimes referred to herein as a processor board 110, and a second chassis 112, sometimes referred to herein as a power board 112. The processor board 110 and the power board 112 are connectable to one another by one or more flexible circuits. In the non-limiting embodiment described herein, a first flexible circuit 116 and a second flexible circuit 118 connect the processor board 110 to the power board 112. The first flexible circuit 116 and the second flexible circuit 118 are able to transfer power between the power board 112 and the processor board 110 while being flexed or bent in a manner similar to a ribbon-type data cable.

Spatial reference axes are used herein to describe the locations and orientations of the components of the electronic device 100 relative to one another. For illustration purpose, the spatial reference axes are fixed relative to the power board 112. The spatial reference axes are referred to as the x-axis, the y-axis, and the z-axis, and all are orthogonal to one another. In addition to the spatial reference axes described above, other reference axis are used herein to described the locations of the processor board 110 and the power board 112 relative to one another. As shown in FIG. 1, the processor board 110 extends or is oriented along an axis AA and the power board 112 extends or is oriented along an axis BB. In the configuration of the electronic device 100 shown in FIG. 1, the axis AA and the axis BB are substantially parallel. In other configurations of the electronic device 100, the axis AA and the axis BB may be at other angles relative to one another. It should be noted that the axis BB is substantially parallel to the x-axis.

Figure 2:
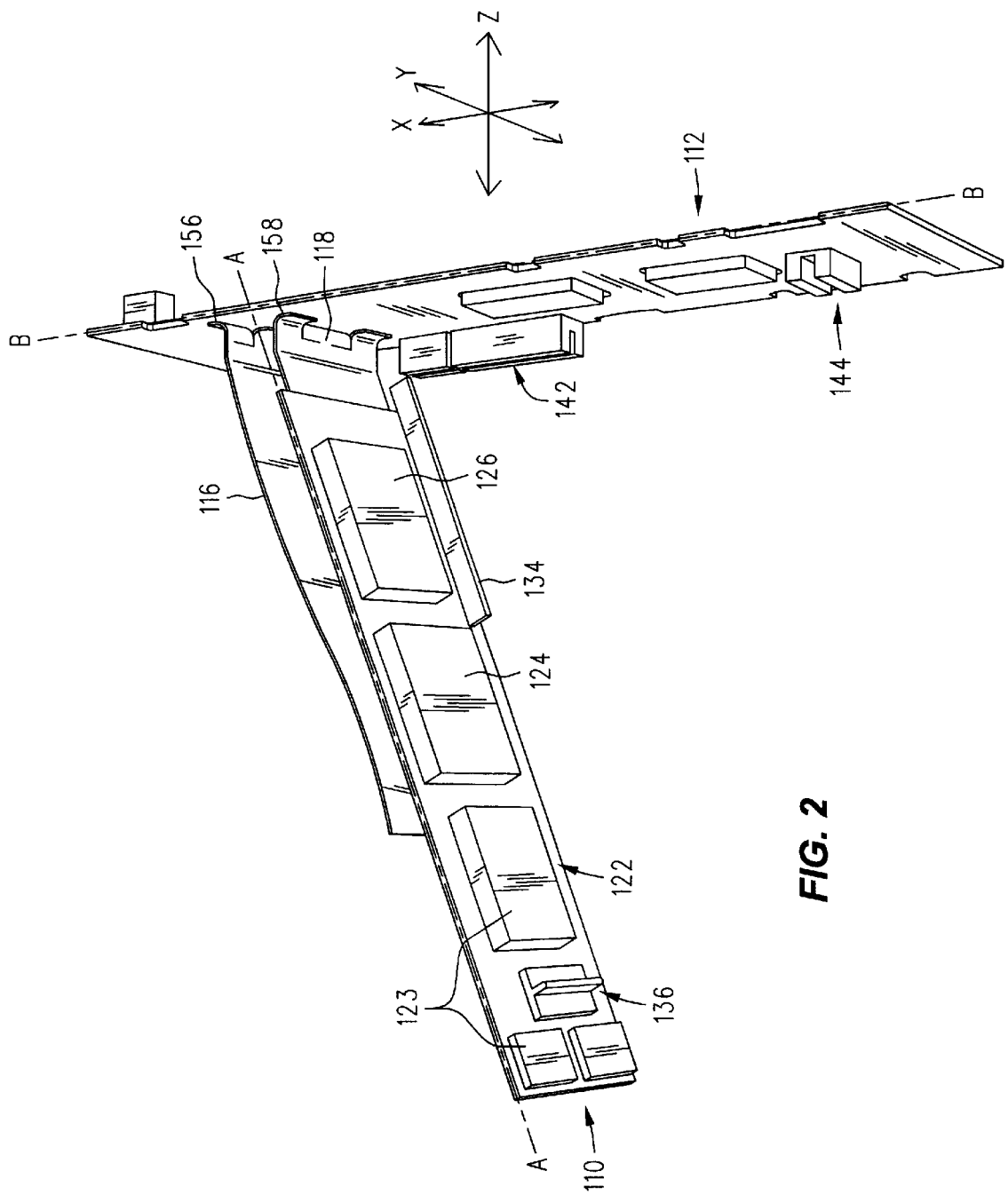
FIG. 2 is a top perspective view of an embodiment of the electronic device of FIG. 1 showing an arrangement between a processor board and a power board.

FIG. 2 is a top perspective view of the electronic device 100 shown in a different configuration and described in greater detail below. The processor board 110 may have plurality of microprocessors 112 and their accompanying electronic components 123 located thereon. The non-limiting embodiment of the processor board 110 described herein has two microprocessors, which are referred to as a first microprocessor 124 and a second microprocessor 126. It should be noted that any number of microprocessors 122 and electronic components 123 may be located on the processor board 110 The processor board 110 serves to process data and the power board 112 serves to supply power to the processor board 110. It should be noted that data may be transmitted through the power board 112 by way of the first flexible circuit 116 and the second flexible circuit 118. In other embodiments of the electronic device 100, other electronic components, such as ASIC's, may be attached to the processor board 110 in addition to or in place of the microprocessors 122. Accordingly, other embodiments of the processor board 110 may serve functions other than processing data.

It should be noted that the axis AA and the axis BB are at different angles relative to one another in the configuration of the electronic device 100 of FIG. 2 than they were in the configuration of the electronic device 100 of FIG. 1. As described in greater detail below, the processor board 110 and the power board 112 may move relative to each other, which changes the angle between the axis AA and the axis BB. The first flexible circuit 116 and the second flexible circuit 118 function similar to hinges, which enable the processor board 110 and the power board 112 to pivot relative to each other. As described in greater detail below, the movement of the processor board 110 relative to the power board 112 enables them to be readily disconnected and reconnected to one another. For example, when the electronic device 100 is in the embodiment shown in FIG. 2, the power board 112 may be readily connected or disconnected from the first flexible circuit 116 and the second flexible circuit 118.

In addition to the microprocessors 122 and the electronic components 123, the processor board 110 may have a first tab 134 and a second tab 136 extending therefrom. As shown in FIG. 2, the first tab 134 may extend in a direction substantially parallel to the axis AA and the second tab 136 may extend in a direction substantially perpendicular to the axis AA. As described in greater detail below, the tabs 134, 136 serve to align the processor board 110 with the power board 112 when the processor board 110 and the power board 112 are located in close proximity to one another as shown in FIG. 1. In addition to alignment, the tabs 134, 136 may also serve to secure the processor board 110 to the 110 as described in greater detail below. It should be noted that the tabs 134, 136 are not necessarily a requirement of the processor board 110. It should also be noted that the processor board 110 may have more or less than two tabs extending in any number of directions.

Figure 3:
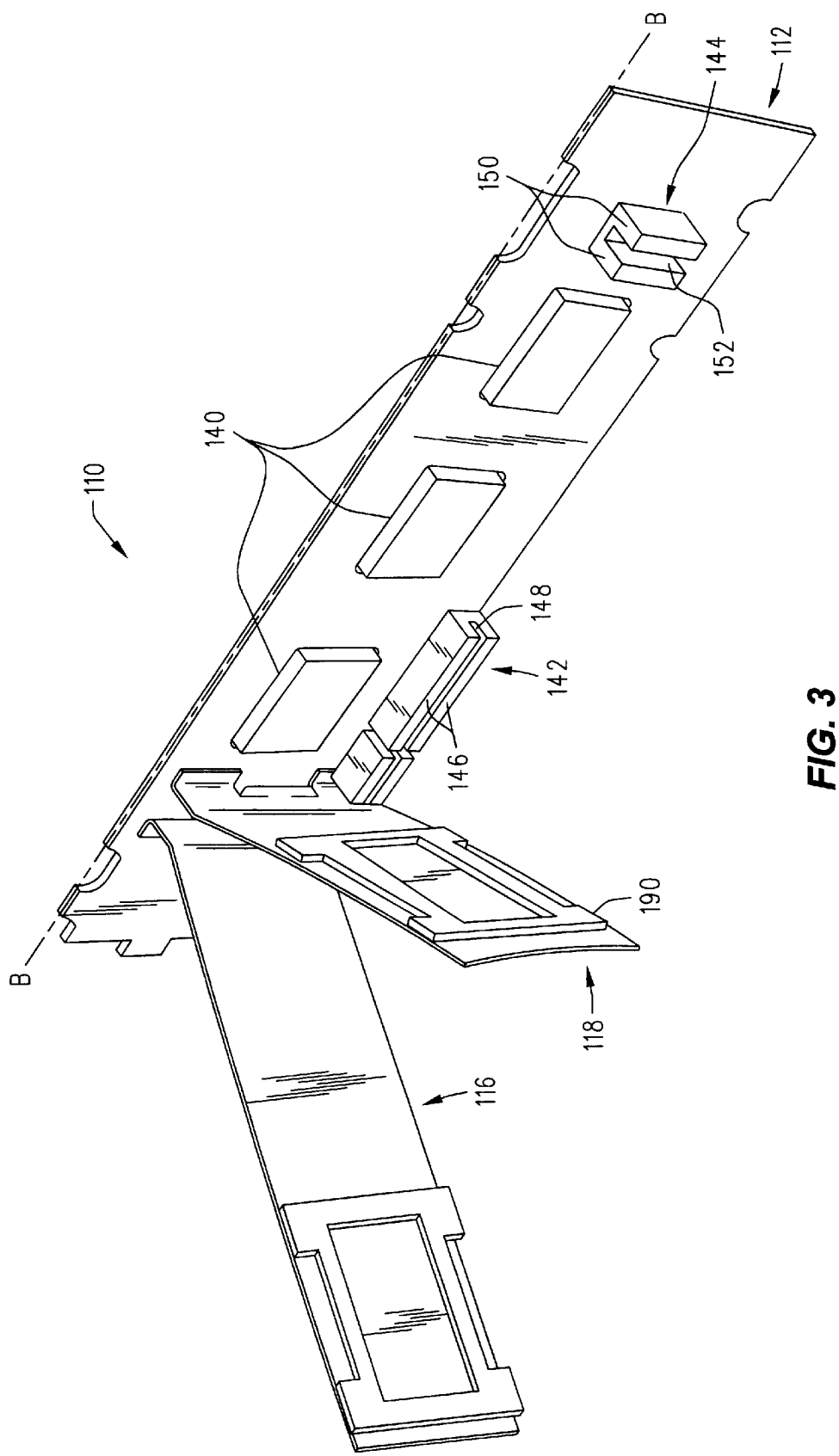
FIG. 3 is a top perspective view of an embodiment of the power board of FIG. 1.

A top perspective view of the electronic device 100 with the processor board 110, FIG. 2, removed therefrom is shown in FIG. 3. With additional reference to FIG. 2, the power board 112 may have power generating components 140 located thereon that serve to supply power to the microprocessors 122 and electronic components 123 located on the processor board 110. The power generating components 140 may, as examples, provide power or convert power to levels required for the operation of the processor board 110.

The power board 112 may have a first slot 142 and a second slot 144 located thereon or formed therein. The first slot 142 may be formed from two extended portions 146 with a recessed portion or slot 148 located therebetween. In the non-limiting example shown in FIG. 3, the recessed portion 148 extends in a direction substantially parallel to the axis BB. Accordingly, the first slot 142 is referred to herein as extending in a direction substantially parallel to the axis BB. The second slot 144 may have two extended portions 150 with a recessed portion 152 located therebetween, wherein the recessed portion 152 extends in a direction substantially perpendicular to the axis BB. Accordingly, the first slot 142 is referred to herein as extending in a direction substantially perpendicular to the axis BB. The slots 142, 144 have been described herein as being formed from the extended portions 146, 150 respectively. In another embodiment of the power board 112, the slots 142, 144 are formed by cutting or otherwise forming slots directly into the power board 112.

With additional reference to FIG. 2, the slots 142, 144 serve to receive the tabs 134, 136 when the processor board 110 and the power board 112 are located adjacent one another as shown in FIG. 1. When the processor board 110 is placed adjacent the power board 112, the first tab 134 is received into the first slot 142 and the second tab 136 is received into the second slot 144. When this is accomplished, the processor board 110 is prevented from significantly moving in either the x-direction or the y-direction relative to the power board 112. Movement may be provided in the z-direction in order to provide for tolerances between the processor board 110 and the power board 112. For example, the tolerance in the z-direction may provide for height tolerances in the microprocessors 122, the electronic components 123, and the power generating components 140 located on the processor board 110 and the power board 112.

In one embodiment of the electronic device 100, the tabs 134, 136 and the slots 142, 144 may have locking mechanisms or interference fits that serve to secure the processor board 110 to the power board 112 when they are in close proximity as shown in FIG. 1. The processor board 110 has been described as having tabs 134, 136 and the power board 112 has been described as having slots 142, 144. The tabs 134, 136 and slots 142, 144 may be interchanged wherein the tabs 134, 136 are located on the power board 112 and the slots 142, 144 are located on the processor board 110.

Figure 4:
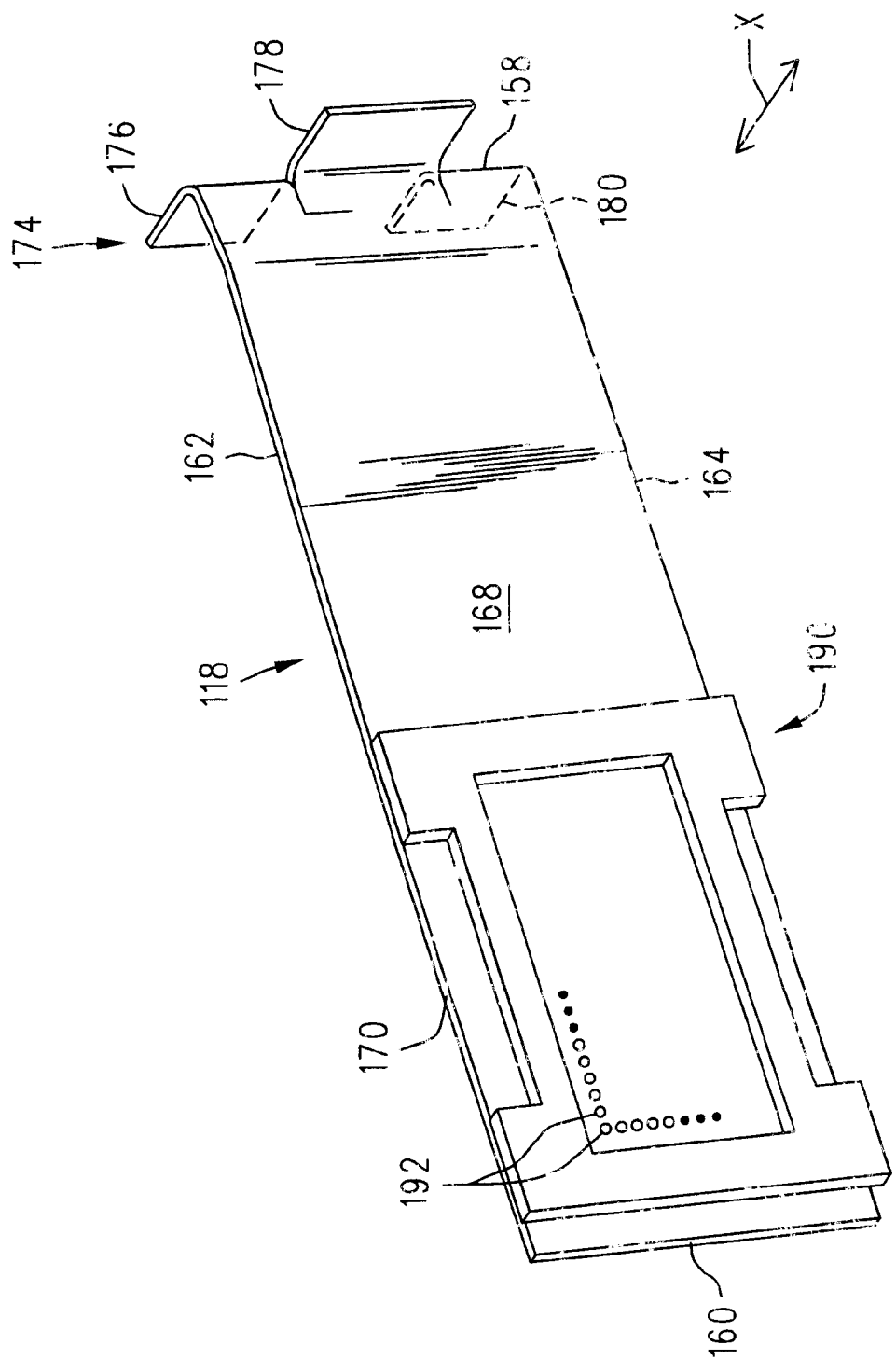
FIG. 4 is a side perspective view of an embodiment of a first flexible circuit of the electronic device of FIG. 1.

FIG. 1 shows an embodiment of the connection between the first flexible circuit 116 and the second flexible circuit 118 to the power board 112. A first end 156 of the first flexible circuit 116 and a first end 158 of the second flexible circuit 118 are operatively or otherwise electrically and/or mechanically connected to the power board 112, i.e., soldered. A side perspective view of the second flexible circuit 118 separate from the processor board 110 and the power board 112 is shown in FIG. 4. In addition to the first end 158, the second flexible circuit 118 has a second end 160, an upper edge 162, and a lower edge 164. The above-described ends and edges of the second flexible circuit 118 define boundaries of a front side 168 of the second flexible circuit 118 A back side 170 is oppositely disposed relative to the front side 168.

The portion of the second flexible circuit 118 in the proximity of the first end 158 may be cut or otherwise split to form a plurality of tabs 174. In the non-limiting embodiment of the second flexible circuit 118 described herein, three tabs 174 are formed in the proximity of the first end 158. The tabs 174 are individually referred to as a first tab 176, a second tab 178, and a third tab 180. The tabs 174 extend in directions substantially along the x-axis and may extend in alternating directions as shown in FIG. 4. In the non-limiting embodiment described herein, the first tab 176 and the third tab 180 extend in a first direction substantially parallel to the x-axis. The second tab 178 extends in a substantially opposite direction parallel to the x-axis. The first end 156 of the first flexible circuit 116, FIG. 1, may be substantially similar to the first end 158 of the second flexible circuit 118 as shown in FIG. 4. Other embodiments of the first end 158 of the second flexible circuit 118 are described below.

Figure 5:
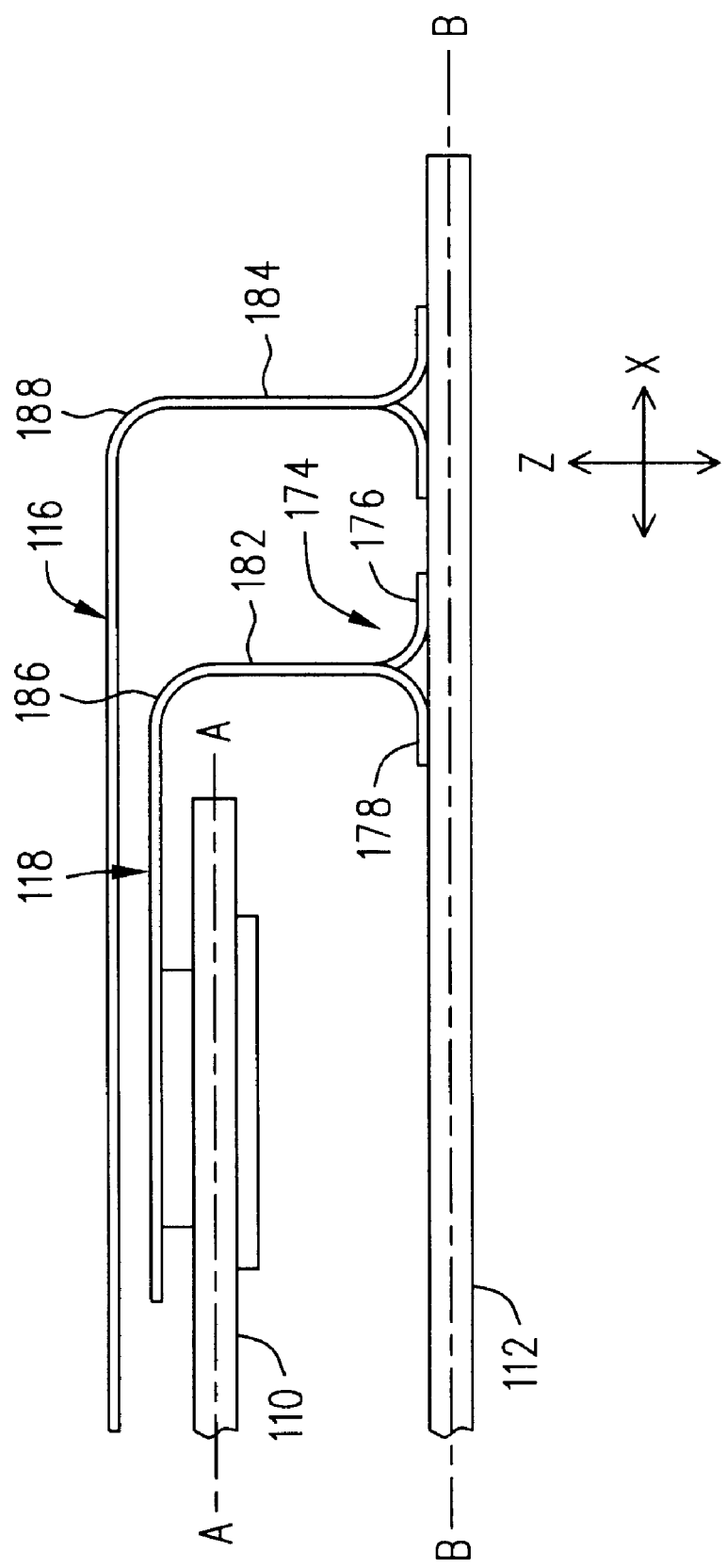
FIG. 5 is a top view of an embodiment of the connection between the flexible circuits and the power board of FIG. 1.

Referring to FIG. 5, which is a plan view showing the connection of the first flexible circuit 116 and the second flexible circuit 118 to the power board 112, the tabs 174 serve to reinforce the connections between the flexible circuits 116, 118 and the power board 112. The first tab 176 and the second tab 178 of the second flexible circuit 118 are visible in the view of FIG. 5. As shown in FIG. 5, the tabs 176, 178 extend in opposite directions along the x-axis, which serves to maintain a first portion 182 of the second flexible circuit 118 in a substantially fixed position relative to the power board 112. The attachment of the second flexible circuit 118 to the power board 112 also reduces the possibility that the second flexible circuit 118 will peal or tear from the power board 112. The first portion 182 of the second flexible circuit 118 is the portion of the second flexible circuit 118 that is adjacent or otherwise in close proximity to the power board 112. In the embodiment of the electronic device 100 described herein, the first portion 182 extends along the z-axis and is maintained in this position with little movement relative to the power board 112. The first flexible circuit 116 may also have a first portion 184 that is substantially similar to the first portion 182 of the second flexible circuit 118.

A bend 186 is located adjacent the first portion 182 of the second flexible circuit 118. A bend 188 is located adjacent the first portion 184 of the first flexible circuit 116. The bends 186, 188 serve as pivot points in the flexible circuits 116, 118. The pivot points enable the processor board 110 and the power board 112 to be moved relative to one another without being fully detached from one another. The bends 186, 188 also serve to keep the first flexible circuit 116 and the second flexible circuit 118 in fixed positions so that they do not interfere with other items located in the proximity of the electronic device 100.

The tabs 174 may have conductors, not shown in FIG. 5, that are electrically and mechanically connected or connectable to conductors, not shown in FIG. 5, located within the power board 112. For example, conductors within the tabs 174 may be soldered to conductors within the power board 112. It should be noted that the connection of the tabs 174 to the power board 112 provides for the transfer of power and, in one embodiment, data between the processor board 110 and the power board 112.

Referring again to FIG. 4, a connector or socket 190 may be electrically and mechanically connected to the second flexible circuit 118 in the proximity of the second end 160. The socket 190 may have a plurality of conductors 192 extending therefrom that electrically connect to conductors, not shown in FIG. 4, located within the second flexible circuit 118. The conductors 192 serve to electrically and mechanically connect to conductors, not shown in FIG. 4, on the power board 112 FIG. 1, which are connected to the second microprocessor 126.

Figure 6:
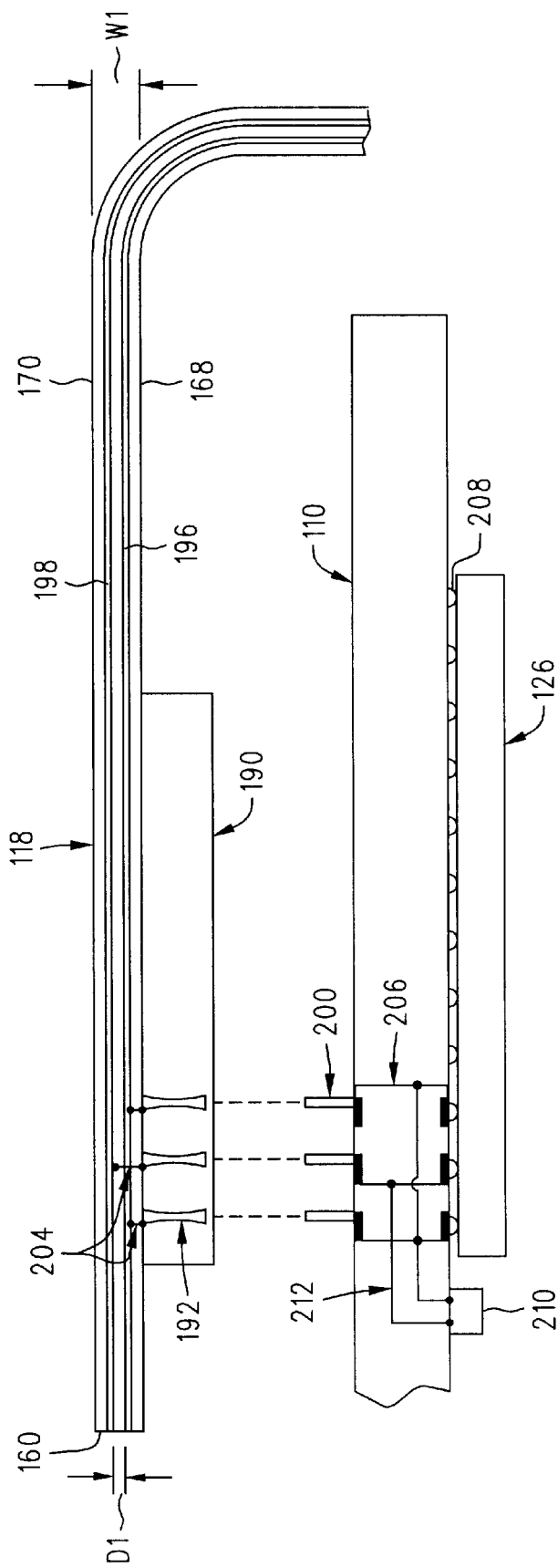
FIG. 6 is a side, cut away view of an embodiment of the flexible circuit and connector of the electronic device of FIG. 1.

A greatly enlarged side, cut away view of the second flexible circuit 118 and the processor board 110 is shown in FIG. 6. The processor board 110 and the second flexible circuit 118 are not connected in the illustration of FIG. 6. However, FIG. 6 clearly shows how they are to be connected. The second flexible circuit 118 has a width W1 extending between the front side 168 and the back side 170. In the non-limiting embodiment of the second flexible circuit 118 described herein, the width W1 is approximately 0.140 inches. The second flexible circuit 118 has a first conductor, sometimes referred to herein as a power plane 196, and a second conductor, sometimes referred to herein as a ground plane 198, located therein. The power plane 196 and the ground plane 198 may be separated by a dielectric at a distance D1. In the non-limiting embodiment of the second flexible circuit 118 described herein, the distance D1 may be approximately 1.8 to 2.2 mils. It should be noted that the second flexible circuit 118 is described herein as only having one power plane 196 and one ground plane 198. It is to be understood that the second flexible circuit 118, and the first flexible circuit 116, FIG. 1, may have a plurality of power planes and ground planes. The plurality of conductive planes may be arranged similar to the power plane 196 and the ground plane 198 described herein.

Figure 7:
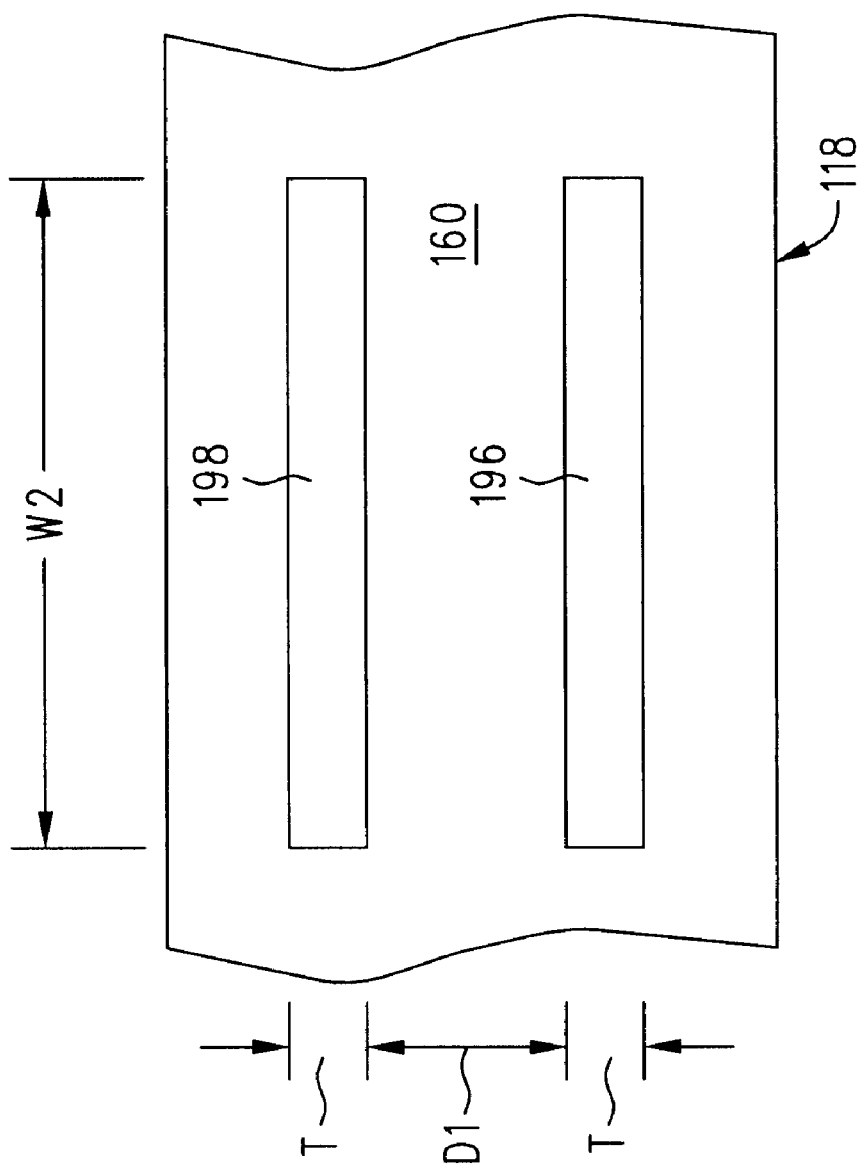
FIG. 7 is a cut away view of and embodiment of the end of the flexible circuit of the electronic device of FIG. 6.

A cut away view of the second end 160 of the second flexible circuit 118 is shown in FIG. 7. It should be noted that FIG. 7 only shows the arrangement of the power plane 196 and the ground plane 198 and that other conductors, not shown, may be located within the second flexible circuit 118. For example, other conductors that serve to transmit data may be located within the second flexible circuit 118. Both the power plane 196 and the ground plane 198 have thicknesses T. In the non-limiting embodiment of the second flexible circuit 118, the thickness T is based on the power plane 196 and the ground plane 198 being formed from two ounce to four ounce copper. In the non-limiting embodiment of the first flexible circuit 116 described herein, both the power plane 196 and the ground plane 198 have the same width W2. In the non-limiting embodiment of the first flexible circuit 116 described herein, the width W2 is approximately 2.1 inches. It should be noted that the power plane 196 is aligned with the ground plane 198 to form power transmission line that is electrically similar to a parallel plate capacitor. In the embodiment described herein, the effective capacitance between the parallel plates is approximately 1.0 pf.

Referring again to FIG. 6, the conductors 192 on the socket 190 may be hollow and may be adapted to receive conductors 200 located on the processor board 110. Thus, the processor board 110 may be connectable to the second flexible circuit 118 and the power board 112. A plurality of vias 204 may electrically connect the conductors 192 to the power plane 196 and the ground plane 198. Accordingly, the conductors 192 serve to provide power to the processor board 110 as is described in greater detail below. It should be noted that other conductors 192 in the socket 190 may serve to connect to other conductive planes, not shown, in the second flexible circuit 118. For example, the other conductors 192 may serve to transmit data to and from the processor board 110.

As described above, the processor board 110 has a plurality of conductors 200 located thereon. The conductors 200 are connected by a plurality of vias 206 to conductors 208 that are associated with the second microprocessor 126. In one embodiment, the second microprocessor 126 is soldered to the processor board 110 and the conductors 208 are solder pads. In another embodiment, the second microprocessor 126 is connected to the processor board 110 by the use of a socket. Accordingly, in this embodiment, the conductors 208 represent both sockets on the processor board 110 and pins on the second microprocessor 126.

The processor board 110 of FIG. 6 has a capacitor 210 located thereon, which is representative of one of a plurality of capacitors and other components that may be connected to the processor board 110. As shown in FIG. 6, the capacitor 210 is connected to the vias 206, which connect the capacitor 210 to the power plane 196 and ground plane 198 when the processor board 110 is connected to the second flexible circuit 118. The capacitor 210 serves to attenuate transients and other voltage fluctuations between the power plane 196 and the ground plane 198.

As shown in FIG. 6, the conductors 208 are connected directly to vias 206, which connect to the second flexible circuit 118. Thus, few long conductive lands or traces are required to be located on the processor board 110. More specifically, the vias 206 may connect the conductors 208 to the second flexible circuit 118 without the need for long lands or traces. The lack of long conductive lands further reduces the inductance associated with the delivery of power to the second microprocessor 126. It should be noted that small conductive lines 212 may connect the capacitor 210 to the vias 206. The capacitor 210 may be located in close proximity to the vias 206 that supply power to the second microprocessor 126. Therefore, the lines 212 may be very short and may be formed of half ounce copper. The lines 212 may be short enough so as not to have any significant affect on the inductance of the processor board 110.

Having described the physical properties of the electronic device 100, FIG. 1, the operating properties of the electronic device 100 will now be described.

Referring again to FIG. 1, the first flexible circuit 116 and the second flexible circuit 118 serve to electrically connect the processor board 110 to the power board 112. The flexible circuits 116, 118 may also serve to mechanically connect the processor board 110 to the power board 112. As described in greater detail below, the flexible circuits 116, 118 provide a low resistance and low inductance power transfer means between the power board 112 and the processor board 110. The low inductance serves to reduce or attenuate transients and other voltage fluctuations on the power supply lines between the power board 112 and the processor board 110. The inductance and resistance may be reduced to an extent that the amount of decoupling capacitance between the power board 112 and the processor board 110 is significantly reduced relative to cable-type connectors. The reduced decoupling capacitance reduces the costs and increases the reliability of the electronic device 100. It should be noted that the inductance and resistance may be reduced so low that they may actually be considered to be characteristics of the power board 112 and not the first and second flexible circuits 116, 118.

By replacing a conventional cable-type connector with the first flexible circuit 116 and the second flexible circuit 118, the inductance between the processor board 110 and the power board 112 is minimized. Because the second flexible circuit 118 is a flexible, circuit having parallel plane conductors, the inductance between the planes is governed by the equation:

$$L \approx \frac{u_o u_r D_1}{W2}$$

With additional reference to FIGS. 6 and 7, assuming that the distance D1 is approximately 2.0 mils, the width W2 is approximately 2.1 inches, and $u_o$ and $u_r$ are permeability constants, the inductance between the power plane 196 and the ground plane 198 is approximately 30.4 pH/inch. The same calculations apply to the conductive planes, not shown, in the first flexible circuit 116. Assuming that the first and second flexible circuits 116, 118 are between two and five inches long, the minimum inductance is approximately 61.0 picohenries and the maximum inductance is approximately 152.0 picohenries. This inductance is approximately forty percent of the inductance associated with a connector that uses cables.

In addition to a minimal inductance, the resistance is also reduced associated with the power plane 196 and the ground plane 198 is also minimized. Using the square counting technique to calculate resistance, a flexible circuit that is five inches long has approximately 2.5 two inch squares. A flexible circuit as described herein that is two inches long and 2.1 inches wide has approximately one two inch square. Assuming that the power plane 196 and the ground plane 198 are made of four ounce copper, they are approximately 4.0 mils thick and have a resistance of approximately 0.121 milliohms per square. Therefore, a flexible circuit that is two inches long has a resistance of approximately 0.121 milliohms and a flexible circuit that is five inches long has a resistance of approximately 0.302 milliohms. It should be noted that other circuit configurations may have planes that are approximately 2.0 mils thick and formed from two ounce copper.

The aforementioned minimal resistance and inductance reduces the transients on the power plane 196 relative to the ground plane 198. It follows that noise on the power plane 196 is also reduced. The noise or change in voltage ΔV is governed by the equation:

$$\Delta V = L\, di/dt + IR$$

When the aforementioned equation is applied to a five inch flexible circuit having an inductance of approximately 152.0 picohenries and a resistance of approximately 0.302 milliohms, the noise is approximately 37.85 millivolts. This noise is a 65% reduction over noise associated with a connector using cables. In addition to the noise and transient reduction, the minimal resistance of the flexible circuits 116, 118 reduces the heat associated with the electronic device, which reduces the cooling equipment and the like that is required to cool the electronic device 100.

Figure 8:
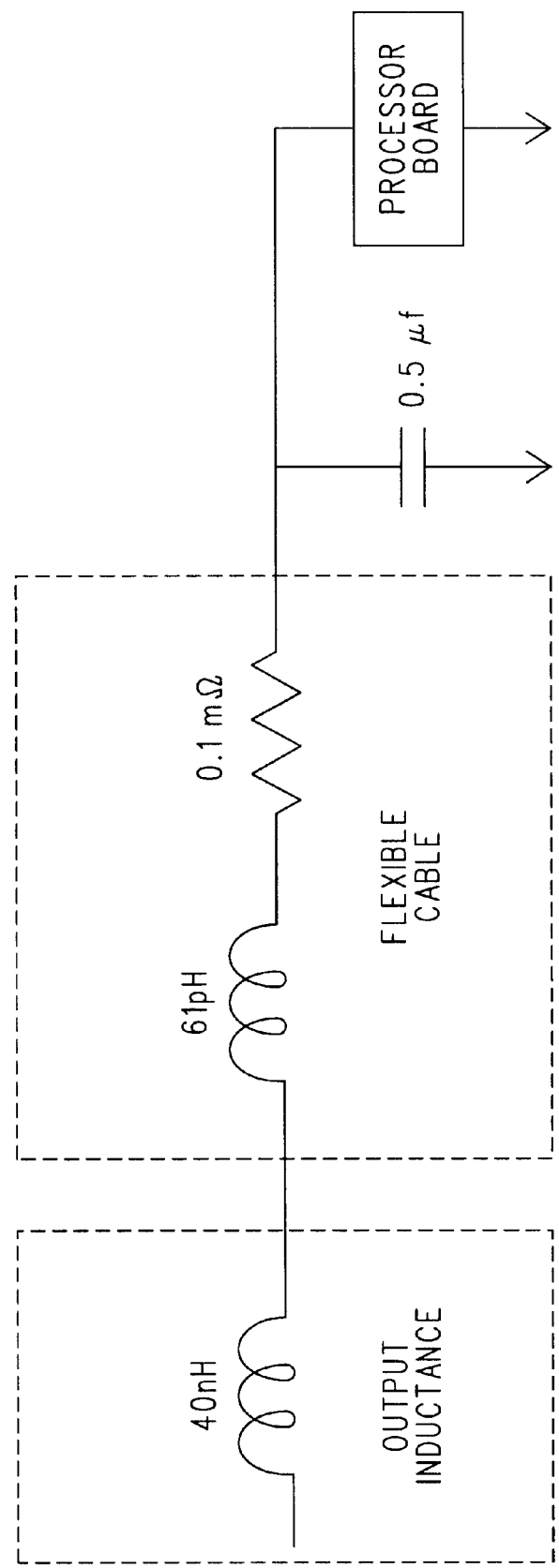
FIG. 8 is an electrical schematic diagram of an embodiment of one of the flexible circuits of FIG. 1.

An electrical schematic of an embodiment of the second flexible circuit 118 being approximately two inches long is shown in FIG. 8. The schematic of FIG. 8 assumes that an inductance of approximately 40.0 nH exists on the output of the power board. As shown in FIG. 8, the flexible cable has an inductance of approximately 61.0 pH and a resistance of approximately 0.1 milliohms. Because the inductance of the flexible cable is between a factor of two and three lower than the inductance of the output impedance, the inductance of the flexible cable is negligible. Accordingly, the inductance of the flexible circuit may be disregarded and a coupling capacitance of only 0.5 uf may be provided.

A cable-type connector does not have the electrical characteristics of the flexible cable. For example, a cable-type connector may have an inductance of approximately four hundred picofarads, which is significant relative to the output impedance of a power supply. In addition, the resistance is typically about 0.7 milliohms. Such a cable-type connector may require several millifarads of coupling capacitance and will have inferior performance.

Having described the electrical characteristics of the electronic device 100, the operational characteristics will now be described.

In addition to reducing transients on the power board 112 and the processor board 110, the electronic device 100 provides for the easy installation and removal of the processor board 110 to and from the power board 112. As described above, the processor board 110 is connectable to the first and second flexible circuits 116, 118. Accordingly, the processor board 110 is connectable to the power board 112. With additional reference to FIG. 2, the processor board 110 is connectable to the power board 112 by connecting the connector 190 on the second flexible circuit 118 and a similar connector on the first flexible circuit 116 to the microprocessors 122. As shown in FIG. 2, the processor board 110 may be readily connected and disconnected to and from the first and second flexible circuits 116, 118 when the axis AA is substantially perpendicular to the axis BB.

After the processor board 110 is connected to the power board 112, the processor board 110 may be moved to a position where it is proximate the power board 112 as shown in FIG. 1. More specifically, the processor board 112 may pivot on the bends 186, 188, FIG. 5, in the first and second flexible circuits 116, 118 to a point where the axis AA is substantially parallel to the axis BB. The first tab 134, FIG. 2, may then be received by the first slot 142. Accordingly, the second tab 136 may be received by the second slot 144. This reduces the movement of the processor board 110 in both the x-direction and the y-direction relative to the power board 112. Mechanisms, not shown, may be provided to lock or secure the tabs 134, 136 into the slots 142, 144. For example, the slots 142, 144 may form interference fits with the tabs 134, 136.

The connectability of the processor board 110 to the power board is useful when the electronic device 100 is located in a larger chassis, not shown. For example, the power board 112 may be secured to the chassis. The processor board 110 may then be mechanically and electrically connected to the power board 112 as described above. Should one of the mircoprocessors 122 need replacement, the processor board 110 as a whole may be readily replaced without removal of the power board 112.

Having described some embodiments of the electronic device 100, other embodiments will now be described.

Referring to FIG. 1, the electronic device 100 was described above with the first flexible circuit 116 and the second flexible circuit 118 connected to different microprocessors 122 on the processor board 110. It should be noted that the first flexible circuit 116 and the second flexible circuit 118 may be replaced with a single flexible circuit that connects to all the microprocessors 122 on the processor board 110.

Referring to FIG. 2, the electronic device 100 has been described herein with the tabs 134, 136 located on the processor board 110 and the slots 142, 144 located on the power board 112. In one embodiment of the electronic device 100, the tabs are located on the power board 112 and the slots are located on the processor board 110.

Figure 9:
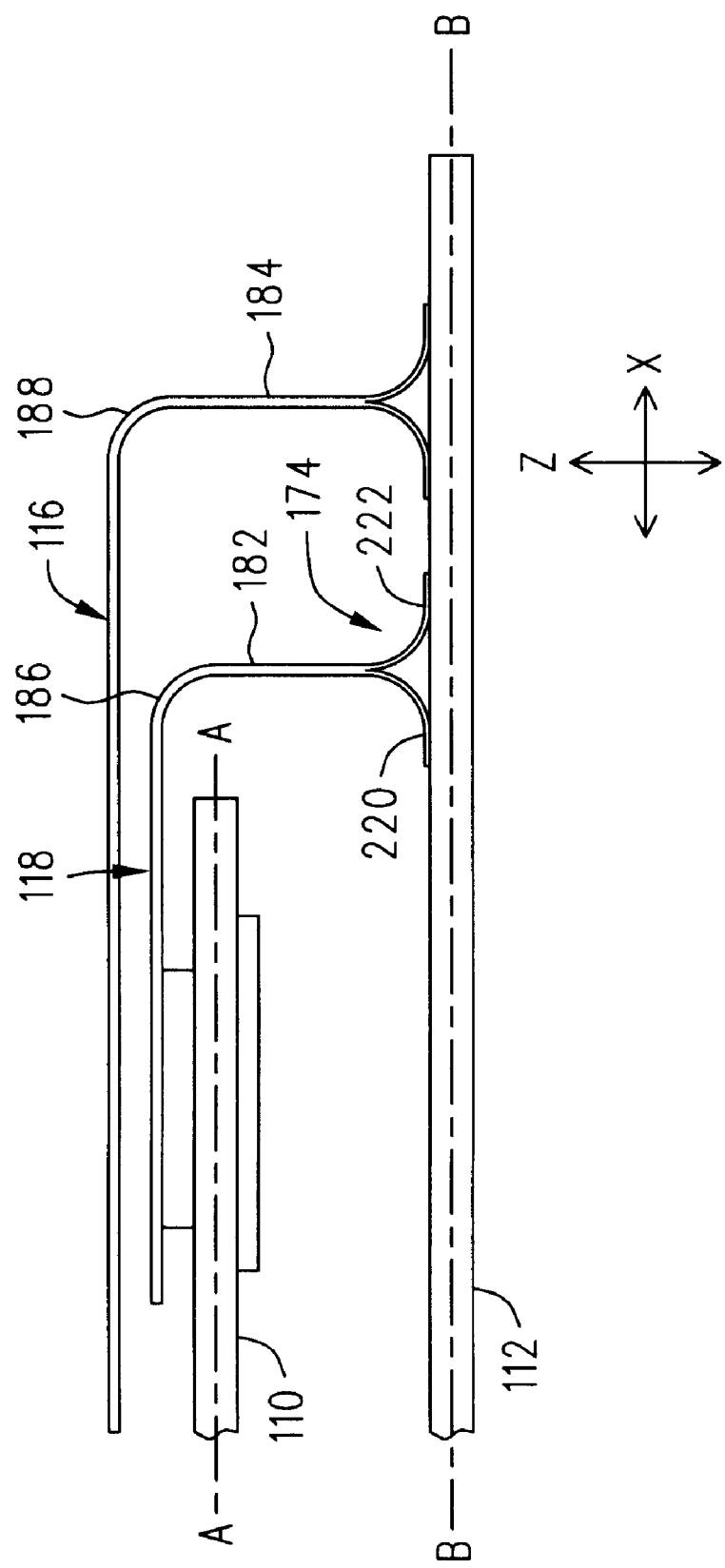
FIG. 9 is a top view of an embodiment of the connection between the flexible circuits and the power board of FIG. 1.

Referring to FIG. 5, the first flexible circuit 116 and the second flexible circuit 118 have been shown having tabs 174 formed thereon that connect to the power board 112. Another embodiment of the connection of the first flexible circuit 116 and the second flexible circuit 118 to the power board 112 is shown in FIG. 9. In the embodiment of FIG. 9, the first portion 182 of the second flexible circuit 118 is split into a first half 220 and a second half 222. The first half 220 may, as an example, have the power plane 196, FIG. 6, and the second half 222 may, as an example, have the ground plane 198, FIG. 2.

Figure 10:
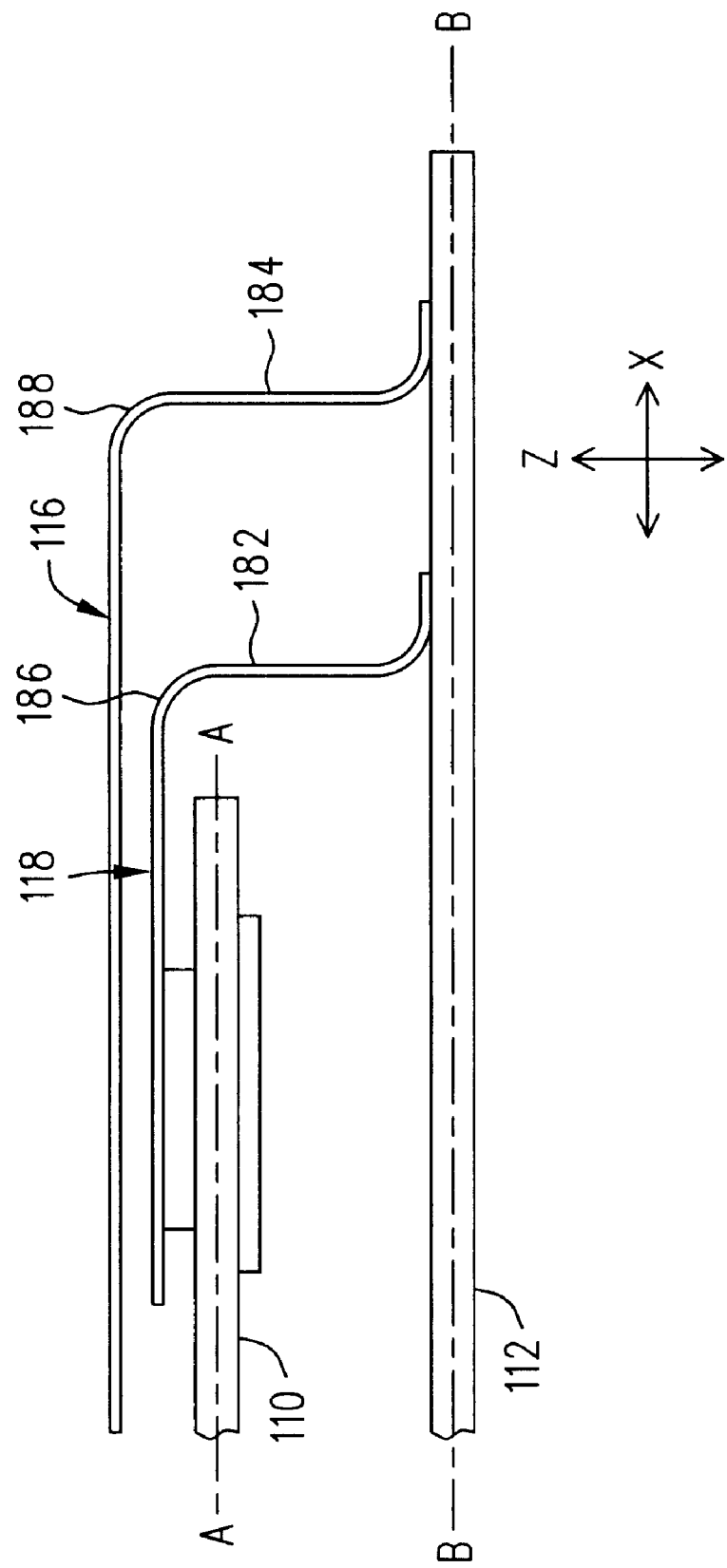
FIG. 10 is a top view of an embodiment of the connection between the flexible circuits and the power board of FIG. 1.

FIG. 10 shows another embodiment of the connection of the first flexible circuit 116 and the second flexible circuit 118 to the power board 112. In the embodiment of FIG. 10, the first portion 182 of the second flexible circuit 118 and the first portion 184 of the first flexible circuit 116 are bend so a portion of each is connected to the power board 112.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. An electronic device comprising:
   a first chassis oriented along a first axis, said first chassis comprising at least one first microprocessor and at least one tab extending therefrom;
   a second chassis oriented along a second axis, said second chassis comprising at least one power generating component connectable thereto and at least one slot located thereon, said at least one tab being receivable in said at least one slot; and
   at least one first flexible circuit extending between said first chassis and said second chassis, said at least one first flexible circuit comprising a first flexible circuit first end and a first flexible circuit second end, said first flexible circuit first end being connectable to said first chassis, said first flexible circuit second end being connectable to said second chassis;
   said first chassis being movable relative to said second chassis between at least a position wherein said first axis is substantially perpendicular to said second axis and a position wherein said first axis is substantially parallel to said second axis.

2. The electronic device of claim 1, wherein said first flexible circuit first end has a first connector attached thereto, said first connector being connectable to said at least one first microprocessor.

3. The electronic device of claim 1, wherein said first flexible circuit second end comprises at least one first tab and at least one second tab, said at least one first tab being connected to said second chassis and extending in a first direction along said second axis, said at least one second tab being connected to said second chassis and extending in a second direction along said second axis, said first direction being opposite said second direction.

4. The electronic device of claim 1, wherein said first chassis further comprises at least one second microprocessor.

5. The electronic device of claim 4, wherein said at least one first flexible circuit is connectable to said at least one second microprocessor.

6. The electronic device of claim 4 and further comprising at least one second flexible circuit connectable between said at least one second microprocessor and said second chassis.

7. The electronic device of claim 1, wherein the distance between said first flexible circuit first end and said first flexible circuit second end is between about two and about five inches.

8. The electronic device of claim 1, wherein said at least one first flexible circuit comprises at least one first conductive plane and at least one second conductive plane extending between said first flexible circuit first end and said first flexible circuit second end, said at least one first conductive plane having a first surface, said at least one second conductive plane having a second surface, said first surface facing said second surface.

9. The electronic device of claim 8, wherein said at least one first conductive plane has a width extending substantially perpendicular to an axis extending between said first flexible circuit first end and said first flexible circuit second end, said width being about 2.1 inches.

10. The electronic device of claim 8, wherein said at least one first conductive plane has a thickness of about 2.0 to about 4.0 mils.

11. The electronic device of claim 8, wherein said at least one first conductive plane has a thickness of about 4.0 mils.

12. The electronic device of claim 8, wherein the distance between said first surface and said second surface is about 1.8 to about 2.2 mils.

13. The electronic device of claim 8, wherein the distance between said first surface and said second surface is about 2.2 mils.

14. The electronic device of claim 8, wherein the inductance between said first conductor and said second conductor is between about 61 picohenries and about 152 picohenries.

15. The electronic device of claim 8, wherein the inductance between said first conductor and said second conductor is about 61 picohenries.

16. The electronic device of claim 8, wherein the inductance between said first conductor and said second conductor is about 30.4 picohenries per inch as measured between said first flexible circuit first end and said first flexible circuit second end.

17. The electronic device of claim 8, wherein the resistance of said first conductor between said first flexible circuit first end and said first flexible circuit second end is between about 0.121 milliohms and about 0.302 milliohms.

18. The electronic device of claim 8, wherein the resistance of said first conductor between said first flexible circuit first end and said first flexible circuit second end is about 0.121 milliohms.

19. The electronic device of claim 1, wherein said first chassis comprises a first tab extending therefrom, said first tab extending substantially parallel to said first axis, said second chassis having a first slot located thereon, said first slot extending substantially parallel to said second axis, said first tab being receivable by said first slot.

20. The electronic device of claim 19, wherein said first chassis further comprises a second tab extending therefrom, said second tab extending substantially perpendicular to said first axis, said second chassis further comprising a second slot located thereon, said second slot extending substantially perpendicular to said second axis, said second tab being receivable in said second slot.

21. The electronic device of claim 1, wherein said second chassis further comprises at least one tab extending therefrom, said first chassis further comprising at least one slot located thereon, said at least one tab being receivable in said at least one slot.

22. The electronic device of claim 1, wherein said second chassis comprises a first tab extending therefrom, said first tab extending substantially parallel to said second axis, said first chassis having a first slot located thereon, said first slot extending substantially parallel to said first axis, said first tab being receivable by said first slot.

23. The electronic device of claim 22, wherein said second chassis further comprises a second tab extending therefrom, said second tab extending substantially perpendicular to said second axis, said first chassis further comprising a second slot located thereon, said second slot extending substantially perpendicular to said first axis, said second tab being receivable in said second slot.

24. The electronic device of claim 1 and further comprising at least one second flexible circuit extending between said first chassis and said second chassis, said at least one second flexible circuit comprising a second flexible circuit first end and a second flexible circuit second end, said second flexible circuit first end being connectable to said first chassis, and said second flexible circuit second end being connectable to said second chassis.

25. The electronic device of claim 24, wherein said at least one first flexible circuit comprises a first flexible circuit surface, wherein said at least one second flexible circuit comprises a second flexible circuit surface, and wherein said first flexible circuit surface substantially faces said second flexible circuit surface.

26. An electronic device comprising:
a first chassis substantially extending along a first axis, said first chassis comprising at least one first microprocessor connectable thereto;
a second chassis substantially extending along a second axis, said second chassis comprising at least one power generating component connectable thereto;
at least one first flexible circuit connectable between said first chassis and said second chassis;
a first tab extending from said first chassis, said first tab being oriented in a first direction; and
a first slot located on said second chassis, said first slot being oriented in said first direction so as to receive said first tab when said first chassis is proximate said second chassis;
said first chassis being movable relative to said second chassis between at least a position wherein said first axis is substantially perpendicular to said second axis to a position wherein said first axis is substantially parallel to said second axis.

27. The electronic device of claim 26, wherein said first tab extends from said second chassis and wherein said first slot is located on said first chassis.

28. The electronic device of claim 26 and further comprising a second tab extending from said first chassis and a second slot located on said second chassis, said first slot extending in a direction not parallel to said first axis and being receivable by said second slot when said first chassis is proximate said second chassis.

29. The electronic device of claim 26 wherein said second tab extends from said second chassis and wherein said second slot is located on said first chassis.

30. The electronic device of claim 26 and further comprising at least one second flexible circuit connectable between said first chassis and said second chassis.

31. The electronic device of claim 30, wherein said at least one first flexible circuit comprises a first flexible circuit surface, wherein said at least one second flexible circuit comprises a second flexible circuit surface, and wherein said first flexible circuit surface substantially faces said second flexible circuit surface.

* * * * *